United States Patent [19]

Moe et al.

[11] Patent Number: 5,052,126
[45] Date of Patent: Oct. 1, 1991

[54] VAPOR DRIER FOR SEMICONDUCTOR WAFERS AND THE LIKE

[76] Inventors: Rolf Moe; Nathaniel F. Spieler; David J. Correia; James J. McMullen, all c/o Bjorne Enterprises, Inc., 46707 Fremont Blvd., Fremont, Calif. 94538-6539

[21] Appl. No.: 541,525
[22] Filed: Jun. 21, 1990
[51] Int. Cl.⁵ .............................. F26B 21/06
[52] U.S. Cl. .......................... 34/78; 34/74; 34/73
[58] Field of Search .................. 34/73, 74, 78

[56] References Cited

U.S. PATENT DOCUMENTS

| 4,777,970 | 10/1988 | Kusuhara | 34/78 X |
| 4,841,645 | 6/1989 | Bettcher et al. | 34/78 |
| 4,868,996 | 9/1989 | Ohmori et al. | 34/78 X |

FOREIGN PATENT DOCUMENTS

| 0117126 | 7/1984 | Japan | 34/73 |
| 0100926 | 4/1989 | Japan | 34/73 |

Primary Examiner—Henry A. Bennett
Assistant Examiner—Christopher Kilner
Attorney, Agent, or Firm—Julian Caplan

[57] ABSTRACT

A drier for wafers or the like has a drier chamber shaped to receive the wafer, which is lowered into the open top of the drier chamber and withdrawn therefrom by a lifter, which may be motor actuated. Below the drier chamber is a heater chamber to vaporize alcohol or other liquid, which rises and condenses on the relatively cool wafer. A water jacket around the top of the drier chamber condenses vapor and thus reduces escape of vapor.

6 Claims, 4 Drawing Sheets

VAPOR DRIER FOR SEMICONDUCTOR WAFERS AND THE LIKE

BACKGROUND OF THE INVENTION

1. Field of the Invention

This invention relates to a new and improved vapor drier for semiconductor wafers and the like, preferably using isopropyl alcohol. More particularly, the invention relates to a module which may be installed in a machine to strip photoresist from semiconductor wafers of the type shown in U.S. Pat. No. 4,850,381. The module dries wafers after they have been rinsed. The device is also usable as a drier module in laboratory and testing environments.

2. Description of Related Art

Wafers of the type used with the present invention have traditionally been dried in a boat in a machine which spins the boat in an alcohol vapor or other environment. The spinning of the wafers may damage them. Further, the wafers first loaded into the boat are delayed in being dried until other wafers have been loaded into the boat and may be damaged by reason of the delay.

Another means for drying wafers is by means of a blast of a gas such as nitrogen. The wet wafer is subjected to a high flow rate of gas which may stir up particulates which may stick to the wafer.

SUMMARY OF THE INVENTION

This invention relates to a module having a loading device which lowers a wafer into a chamber. At the bottom of the chamber is a heater which vaporizes alcohol or other liquid. The alcohol vapor rises into the chamber and condenses on the relatively cool wafer so that the water and condensed alcohol flow by gravity off the wafer. Alternatively the condensed vapor may function as a cleaner. The mixture of alcohol and water is preferably caught in a cup or other receptacle and collected so that it does not dilute the alcohol being vaporized. At the upper end of the chamber is a cooler which condenses vapor which might otherwise escape from the chamber. When the drier is not in use, a flap cover may close the opening of the chamber to prevent evaporation.

One important advantage of the invention is the reduction in damage to the wafers as compared with other drying means. A further feature is the fact that there are less contaminants on the wafer which might otherwise occur if pieces of one wafer were broken off and stuck on an adjacent wafer.

Still another advantage of the invention is the elimination of static charge on the wafers which would occur if gas or fluid is blown over the surface. Static charges tend to pick up particulates from the atmosphere.

Still another advantage over boat-loaded wafer driers is the fact that the present invention can dry a wafer in 30 to 40 seconds, whereas a boat-load of wafers has conventionally required 20 minutes. Subjecting the wafers to a mixture of alcohol and water over a long period of time is undesirable because the mixture is corrosive. Thus the present invention results in less perceived corrosion.

Rapidity of the drying is improved in accordance with the present invention because heating a boat full of wafers requires heating a considerable mass of material, whereas merely heating a single wafer results in more consistent heating and cooling.

Although the device is illustrated and described herein as being used in a wafer stripper machine, nevertheless the drier comprises a module which may be used in a laboratory whereby a single wafer may be inserted. The module may be hand operated for testing and other purposes, if desired. It will also be understood that the device may be used as a cleaner by condensing on the wafer or other object as solvent vapor. In the Specification of this invention the preferred use as an alcohol vapor drier semiconductor wafers is set forth, but it will be understood that the invention has other uses.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1:
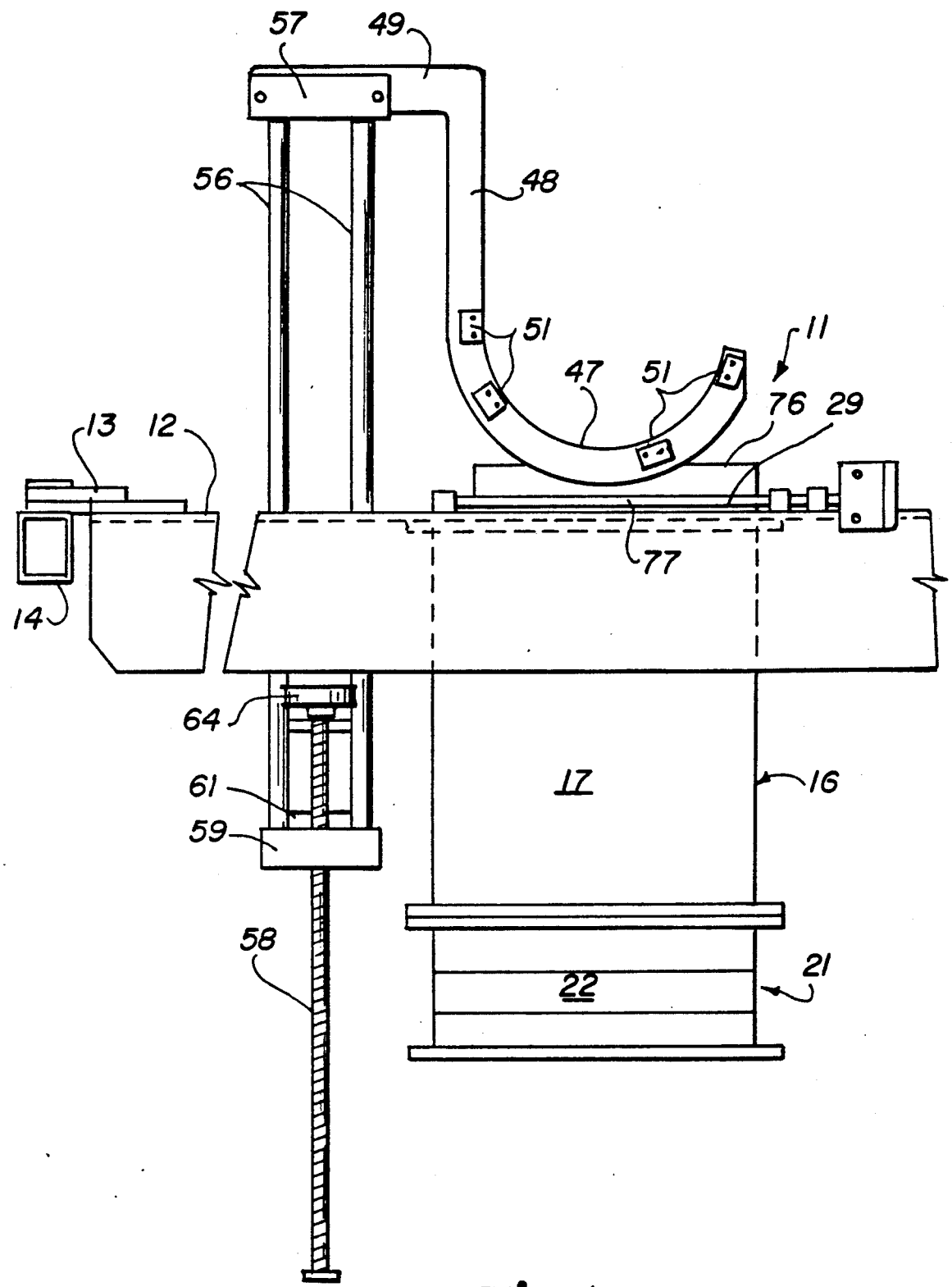
FIG. 1 is a front elevational view of the present invention showing the loader in raised position.
Figure 2:
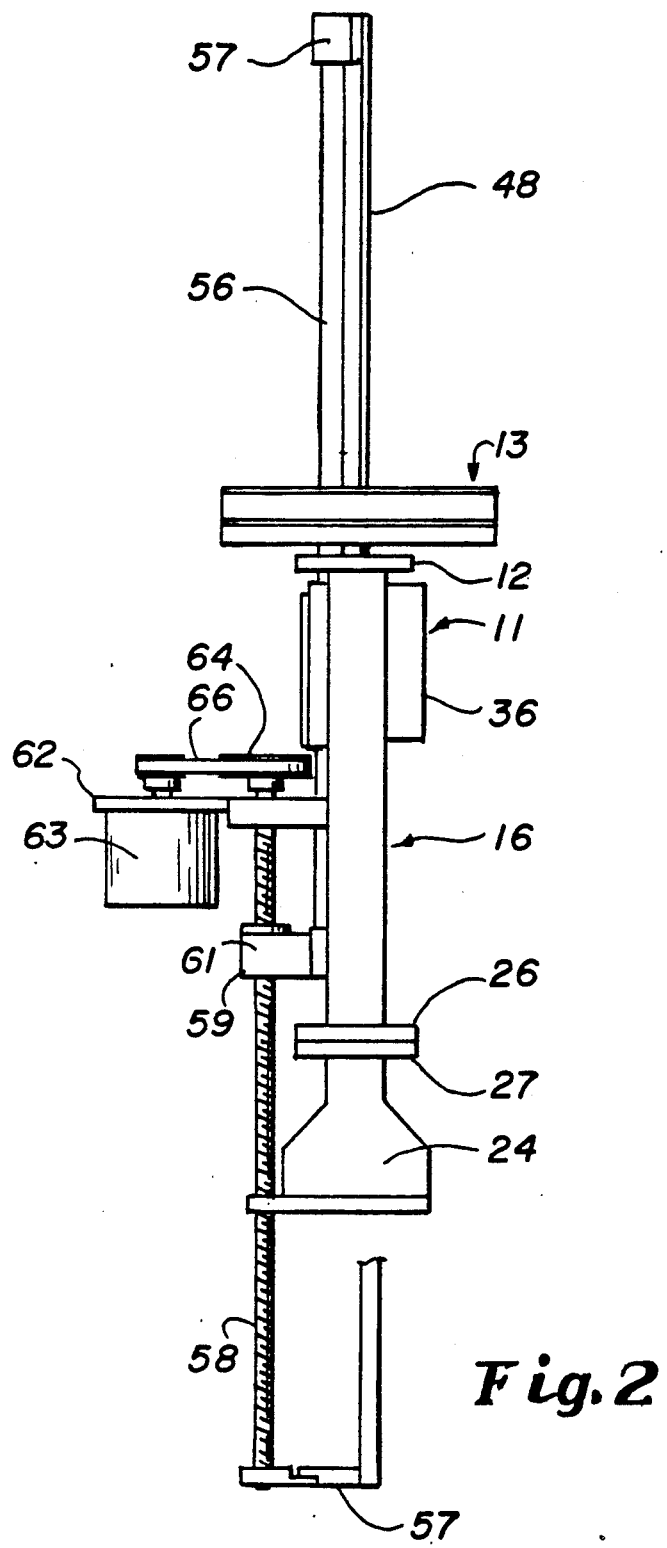
FIG. 2 is a side elevational view of the structure of FIG. 1.
Figure 3:
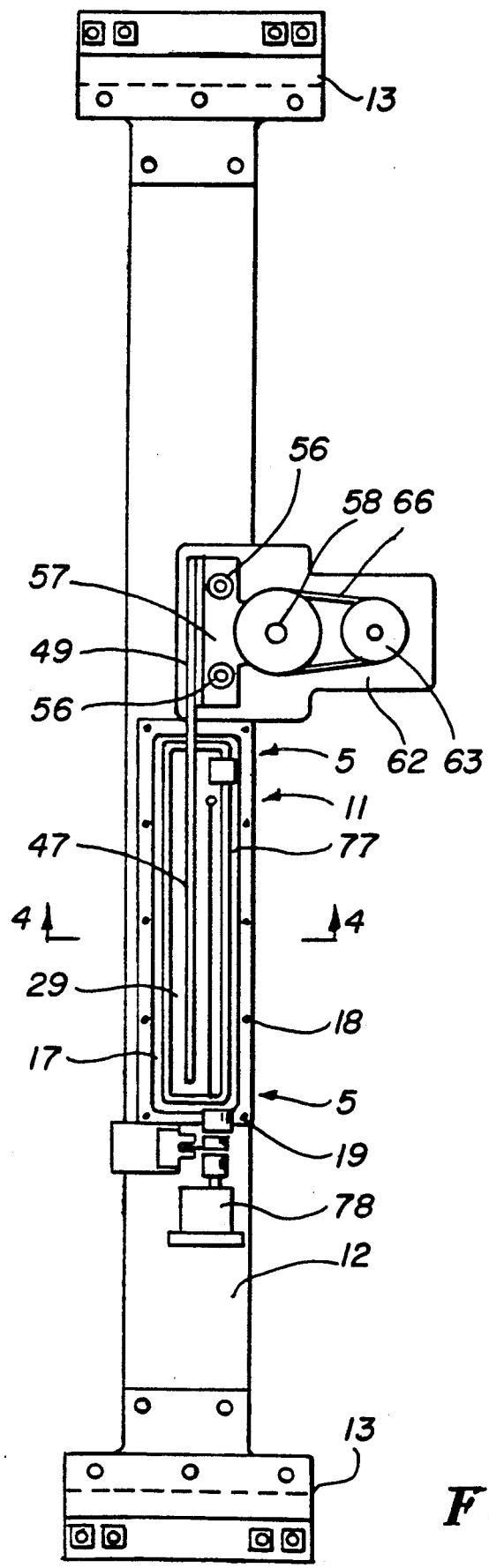
FIG. 3 is a top plan view thereof.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Drier unit 11 is illustrated herein as it may be used in a wafer stripper machine of the type shown in U.S. Pat. No. 4,850,381. Thus the drier unit or module has a horizontal transverse support 12 having at either end pads 13 which rest upon longitudinal machine members 14, which support the module.

Supported midway of the length of support 12 and depending therefrom is a drier chamber 16 having front 17, back 18 and sides 19 which define the enclosed chamber 16. Closing off the bottom of chamber 16 is a heater chamber 21 having downward diverging front 22 and back 23 and vertical sides 24. The chamber 16 has a flange 26 at its bottom and the chamber 21 has a flange 27 at its top which are sealed together in a vapor-tight fashion. Bottom 28 closes off the bottom of heater chamber 21 and thereby the bottom of the drier chamber 16 whereas the top of chamber 16 is formed with an opening 29. Below the heater chamber 21 are electrical heating elements 31 such as Chromalox strip heaters, type PT. It will be understood that other heating elements may be used to vaporize the alcohol within the chamber 21. The alcohol used in the present device may be of various sorts. A preferred alcohol is isopropyl. However, it will be understood that other alcohols and other liquids and even water may be used in the drier. Among such liquids are fluoro- and chloro-hydrocarbons.

Heater chamber 21 is provided with a drain 32 which is open to drain the alcohol from the system when it is necessary to replenish the same. The chamber has a port 33 which functions as a sensor of the level of the alcohol and a port 34 for replacement of the alcohol so that its level is maintained at that of the sensor 33.

At the top of chamber 16 is a cooling section comprising a jacket 36 around the upper end of the chamber 16 having a water inlet 37 and a water outlet 38 through which water circulates to cool the alcohol vapor so that only a small portion escapes through the opening 29. There are upper and lower temperature sensors 39 and 41 in the chamber 16 adjacent the cooling section 36 which may be used by means not shown but well understood in the art to regulate the flow of cooling water through the inlet and outlet ports 37, 38.

As has been stated, the device may be used to dry semi-conductor wafers 44 used in the manufacture of integrated circuits which have been previously treated as by stripping therefrom photoresist and then rinsed. Wafer lifter 46 is dimensioned to support in vertical position a wafer 44. The lifter 46 comprises an arcuate lower portion 47 having a curvature similar to that of the wafer 44. A vertical portion extends up from the arcuate portion 46 and at the top of the portion 48 is a horizontally outward-directed portion 49. Spaced along the arcuate portion 47 are wafer clips 51 which hold the wafer 44 in position. For a description of such clips 51 reference is made to U.S. Pat. No. 4,898,639.

The lifter 46 is raised and lowered by vertical rods 56 which are attached to portion 49 by transverse upper tie 57. Lower tie 59 is connected to the bottom ends of the rods 56 and carries a nut 61 which engages the vertical lead screw 58. Support 62 comprises a base for the motor 63 which drives pulley 64 on the lead screw 58 by means of belt 66. Motor 63 is preferably a stepper motor. Thus, as the motor 63 turns, the lead screw 58 raises and lowers the wafer lifter 46.

Figure 5:
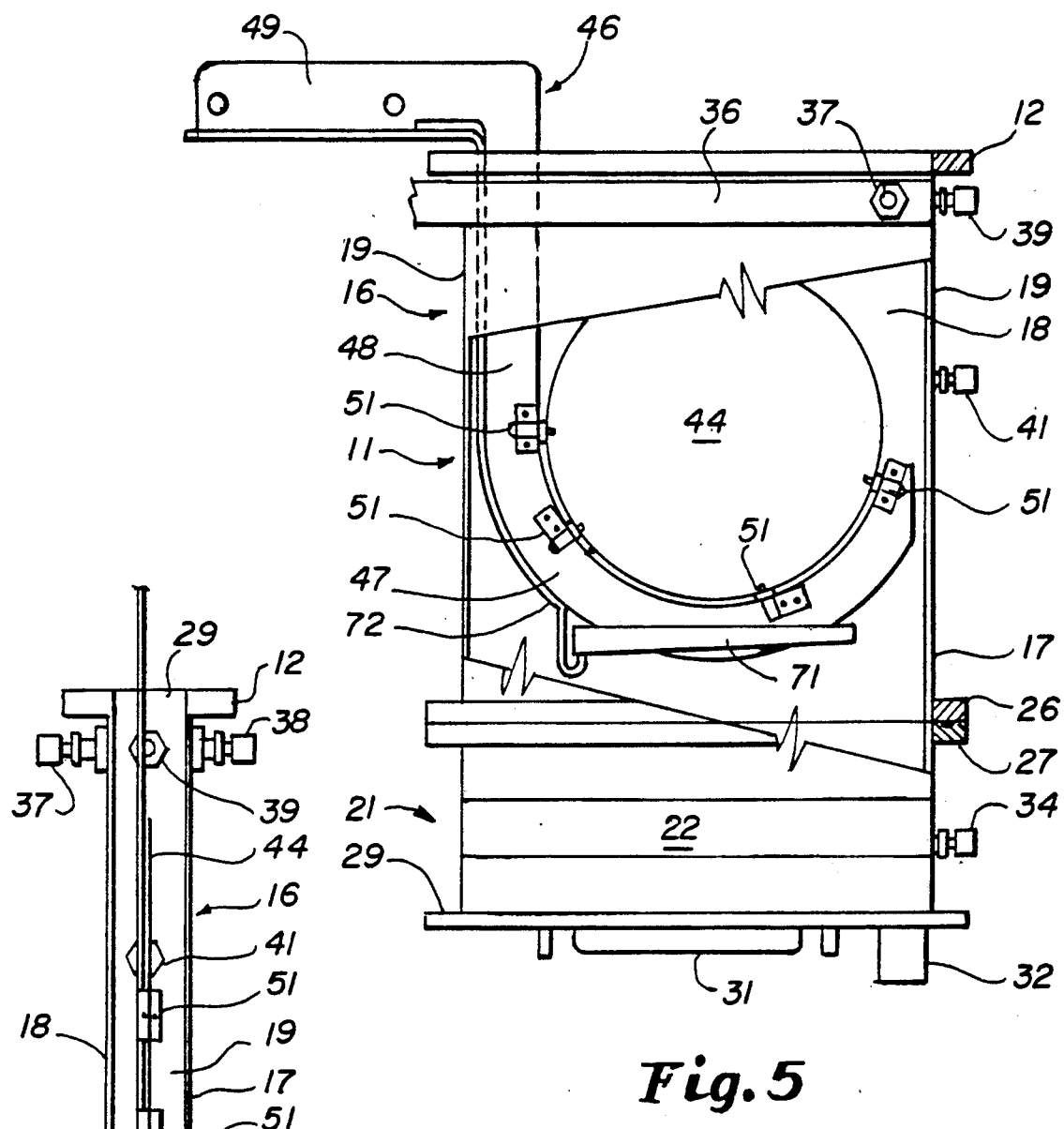
FIG. 5 is a fragmentary side elevational view mostly broken away in section to reveal internal construction and viewed along the line 5—5 of FIG. 3 and also showing the wafer lifter in lowered position.
Figure 4:
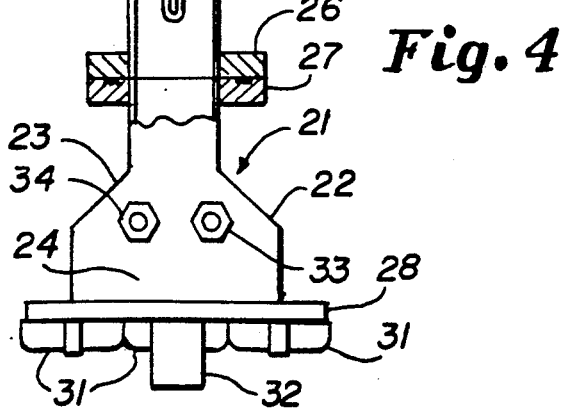
FIG. 4 is a vertical sectional view taken substantially along the line 4—4 of FIG. 3.

The upper position of lifter 46 is shown in FIG. 1. In such position a wafer 44 may be loaded into the clips 51 on the arcuate portion 47. Thereupon, turning of motor 63 lowers the wafer until it assumes the position of FIG. 5. Heater elements 31 vaporize the alcohol in the heater chamber 21 and vapor rises into the drier chamber 16. Since the wafer 44 is relatively cool, the vapor collects on the wafer 44 and flows downwardly by gravity off the surfaces of the wafer 44, thereby removing the water therefrom and heating the wafer 44. The alcohol and water flowing off the wafer 44 are preferably collected by a horizontal cup 71 (see FIG. 5) positioned under the wafer. Drain tube 72 draws the mixture out of the unit 11 so that it does not dilute the alcohol remaining therein.

After a proper time interval, the motor 63 raises the lifter 46 until it again reaches the position shown in FIG. 1, whereupon the wafer 44 may be removed. As the wafer 44 is positioned above the drier unit 11 the alcohol remaining on its surface evaporates.

As a further optional feature of the invention, a flap 76 extending transversely to one side of the opening 29 is supported on a horizontal shaft 77 which may be turned by motor 78. At times, no wafers 44 may be passing through the machine. In order to conserve alcohol, the motor 78, sensing the absence of the wafer 44, turns the shaft 77 until the flap 76 closes opening 29.

It will thus be seen that the present device may be used to dry a wafer 44 or a similar device either as a part of a stripping machine or in a laboratory environment. It will be further understood that the wafer may be lowered into the machine and raised therefrom manually or by means other than the motor drive heretofore described. Important features of the invention, therefore, are that the wafer is placed in a relatively heated temperature while in relatively cooled condition and subjected to alcohol vapor which condenses on the surface of the wafer and as it runs off, clears the water or other undesirable liquid on the wafer therefrom.

As used in the appended claims, the term "drier" is intended to include cleaners and other devices for treating wafers and other objects by alcohol vapor or other vaporized liquids.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A drier for individual thin, flat objects having water or other liquid thereon comprising
    means forming a narrow chamber having an opening at its top,
    heating means at the bottom of said chamber to vaporize liquid therein,
    lifter means reciprocating from a first position above said chamber through said opening to a second position within said chamber whereby an object may be loaded onto said lifter means in first position and then lowered to second position to be treated with vapor and then lifted to first position for unloading, said lifter means having a lower portion complementary to said object shaped to receive only one object at a time and a vertical portion extending upward from said lower portion,
    and actuating means for actuating said lifter means, said actuating means comprising at least one lifter rod, tie means connecting said lifter rod to said lifter means, a lead screw, a nut on said tie means threaded on said lead screw and a motor connected to rotate said lead screw.

2. A drier according to claim 1 which further comprises a cooling section on the upper end of said heater chamber to condense vapor rising up through said heater chamber, said cooling section comprising a water jacket around the exterior of said heater chamber and means for circulating water through said jacket.

3. A drier according to claim 1 which further comprises a flap having a first position closing off said opening and a second position away from said opening and flap actuating means for moving said flap between first and second positions.

4. A drier according to claim 3 in which said flap actuating means comprises a shaft on which said flap is mounted and drive means for oscillating said oscillating shaft.

5. A drier according to claim 4 in which said drive means comprises a motor.

6. A drier for individual thin, flat objects having water or other liquid thereon comprising
   means forming a narrow chamber having an opening at its top,
   heating means at the bottom of said chamber to vaporize liquid therein,
   lifter means reciprocating from a first position above said chamber through said opening to a second position within said chamber whereby an object may be loaded onto said lifter means in first position and then lowered to second position to be treated with vapor and then lifted to first position for unloading, said lifter means having a lower portion complementary to said object shaped to receive only one object at a time and a vertical portion extending upward from said lower portion,
   and actuating means for actuating said lifter means,
   said lifter means further comprising a plurality of clips to hold said object on said lifter means, at least one of said clips being located on said vertical portion to engage one side of said object, and at least some of said clips being located on said lower portion to engage the bottom of said object and the side of said object opposite said vertical portion.

* * * * *